United States Patent
Ooyabu et al.

(10) Patent No.: US 8,796,712 B2
(45) Date of Patent: Aug. 5, 2014

(54) PHOSPHOR LAYER AND LIGHT-EMITTING DEVICE

(75) Inventors: Yasunari Ooyabu, Ibaraki (JP); Satoshi Sato, Ibaraki (JP); Yuki Shinbori, Ibaraki (JP); Shinya Ota, Ibaraki (JP); Hisataka Ito, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/167,370

(22) Filed: Jun. 23, 2011

(65) Prior Publication Data

US 2011/0316032 A1 Dec. 29, 2011

(30) Foreign Application Priority Data

Jun. 29, 2010 (JP) .................................. 2010-147759

(51) Int. Cl.
*H01L 33/50* (2010.01)
(52) U.S. Cl.
USPC .................................... 257/98; 257/E33.061
(58) Field of Classification Search
CPC ...................................................... H01L 33/50
USPC .............................................. 257/98, E33.061
See application file for complete search history.

(56) References Cited

U.S. PATENT DOCUMENTS

| | | | | |
|---|---|---|---|---|
| 2006/0012299 | A1* | 1/2006 | Suehiro et al. | 313/512 |
| 2007/0004065 | A1* | 1/2007 | Schardt et al. | 438/26 |
| 2010/0295070 | A1* | 11/2010 | Su et al. | 257/91 |
| 2011/0248287 | A1* | 10/2011 | Yuan et al. | 257/88 |

FOREIGN PATENT DOCUMENTS

| | | | | |
|---|---|---|---|---|
| JP | 04-094054 | * | 3/1992 | H01J 61/48 |
| JP | 2003-46133 A | | 2/2003 | |
| JP | 2006-165326 | | 6/2006 | |
| JP | 2008-041807 | | 2/2008 | |

OTHER PUBLICATIONS

Notification of Reasons for Refusal issued in corresponding JP Application No. 2010-147759, dispatched on Dec. 3, 2013.
Notification of Reasons for Refusal issued in JP Application No. 2010-147759 dispatched on Jan. 29, 2013.

* cited by examiner

*Primary Examiner* — Marc Armand
(74) *Attorney, Agent, or Firm* — Sughrue Mion, PLLC

(57) ABSTRACT

A phosphor layer is composed of a resin in which phosphor particles and light scattering particles are dispersed.

4 Claims, 4 Drawing Sheets

FIG.2
(a)
(b)
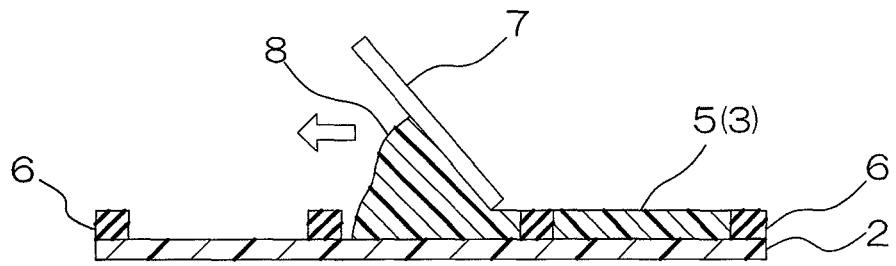
(c)
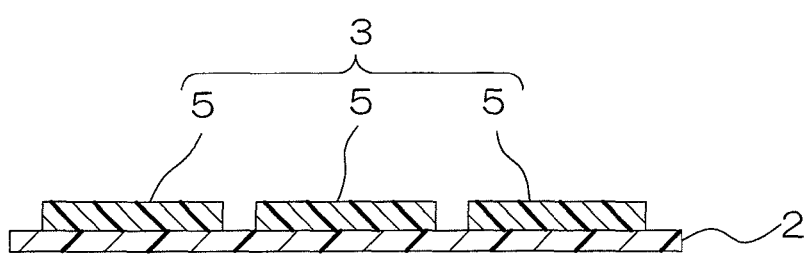
(d)
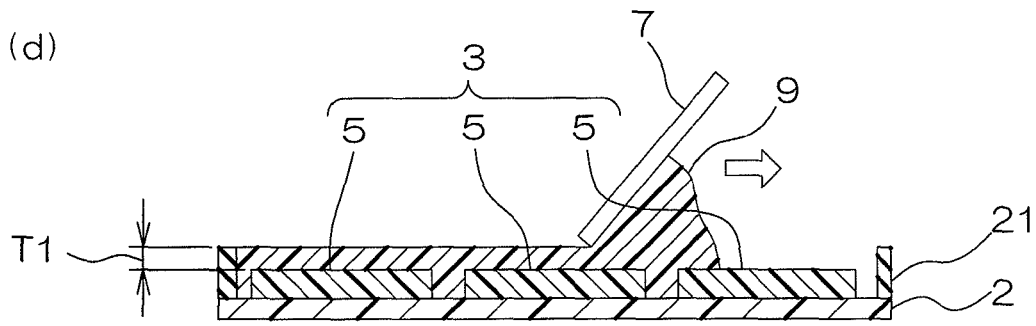
(e)
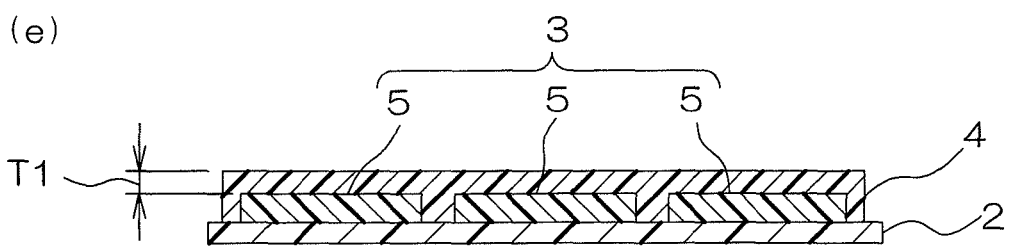

FIG.3
(a) 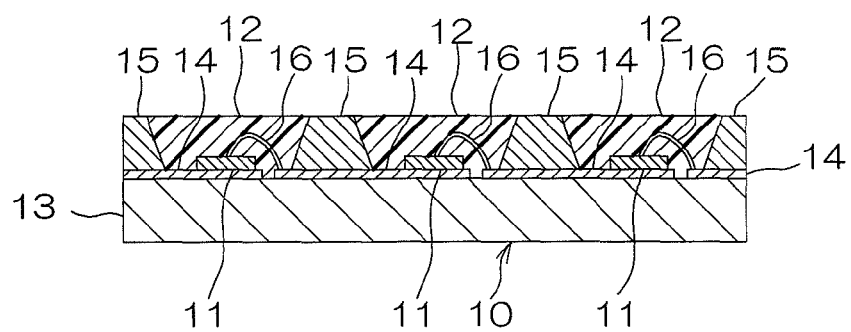
(b) 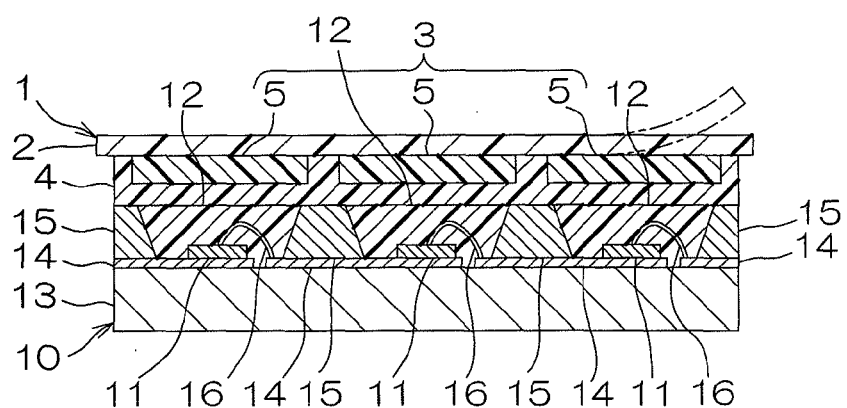
(c) 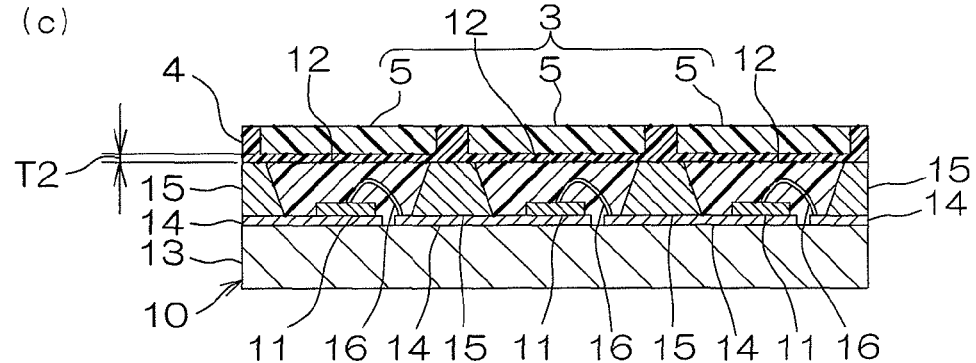
(d) 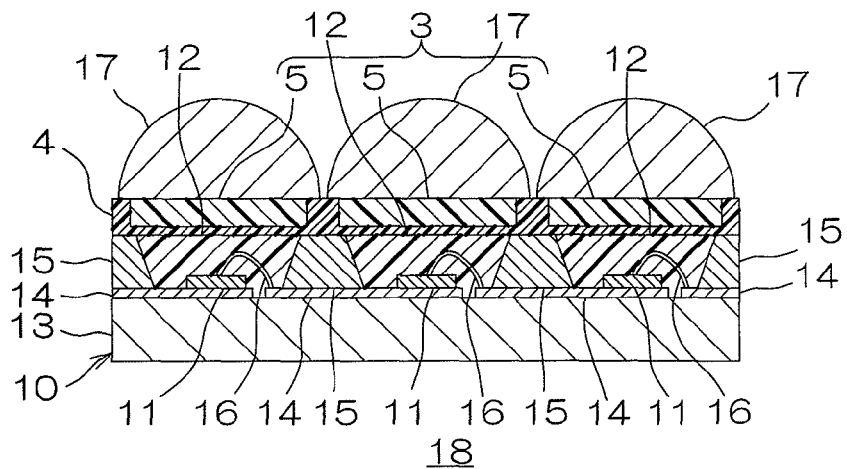

PHOSPHOR LAYER AND LIGHT-EMITTING DEVICE

CROSS-REFERENCE TO RELATED APPLICATION

The present application claims priority from Japanese Patent Application No. 2010-147759 filed on Jun. 29, 2010, the contents of which are hereby incorporated by reference into this application.

BACKGROUND OF THE INVENTION

1. Field of the Invention

The present invention relates to a phosphor layer and a light-emitting device, to be specific, to a light-emitting device preferably used as a white light-emitting device; and a phosphor layer used therefor.

2. Description of Related Art

In recent years, as a light-emitting device that is capable of emitting high-energy light, a white light-emitting device has been known. In the white light-emitting device, for example, a LED (light emitting diode) that emits blue light and a phosphor layer that can convert blue light into yellow light and covers the LED are provided and the white light-emitting device emits high-energy white light by color mixing of the blue light emitted from the LED and the yellow light converted from the blue light in the phosphor layer.

There has been proposed, to be specific, for example, a white light-emitting device is fabricated by providing a molded resin sheet in which phosphors are dispersed is provided above a blue LED chip (ref: for example, Japanese Unexamined Patent Publication No. 2003-46133).

SUMMARY OF THE INVENTION

However, although a plurality of blue LEDs are usually fabricated from one wafer by dicing the wafer, the wafer has variability in the emission wavelength. Thus, among each of the blue LEDs fabricated by the dicing of the wafer, variability of the emission wavelength occurs, and therefore variability in chromaticity increases among the blue lights emitted from each of the blue LEDs.

Thus, there is an increase of variability in chromaticity among the white lights each obtained by color mixing of the blue light emitted from each of the blue LEDs and the yellow light that is converted by the phosphor layer corresponding to each of the blue LEDs.

It is an object of the present invention to provide a phosphor layer that is capable of reducing variability in chromaticity; and a light-emitting device including the phosphor layer.

A phosphor layer of the present invention is composed of a resin in which phosphor particles and light scattering particles are dispersed.

A light-emitting device of the present invention includes a board, a light emitting diode provided on the board, and a phosphor layer that is provided on the board so as to cover the light emitting diode and is composed of a resin in which phosphor particles and light scattering particles are dispersed.

The phosphor layer of the present invention is composed of the resin in which the phosphor particles and the light scattering particles are dispersed, so that in the light-emitting device of the present invention, even when variability of the emission wavelength occurs among each of the light emitting diodes, the conversion to a desired color of light can be achieved while reducing variability in chromaticity by the phosphor layer that covers each of the light emitting diodes.

Therefore, in the light-emitting device of the present invention including the phosphor layer of the present invention, the emission in which variability in chromaticity is reduced can be achieved among the light-emitting devices.

BRIEF DESCRIPTION OF THE DRAWINGS

FIG. 2 shows process drawings for fabricating the transfer sheet for the phosphor layer:

(a) illustrating a step of preparing a release substrate, (b) illustrating a step of applying a particle-containing resin composition onto the release substrate, (c) illustrating a step of forming the phosphor layer, (d) illustrating a step of applying an adhesive composition onto the release substrate, and (e) illustrating a step of forming an adhesive layer.

FIG. 3 shows process drawings for fabricating a light-emitting device of an embodiment of the present invention:

(a) illustrating a step of preparing a board and a light emitting diode, (b) illustrating a step of transferring the phosphor layer on the board by the transfer sheet for the phosphor layer, (c) illustrating a step of curing the adhesive layer, and (d) illustrating a step of providing lenses on phosphor portions.

Figure 4:
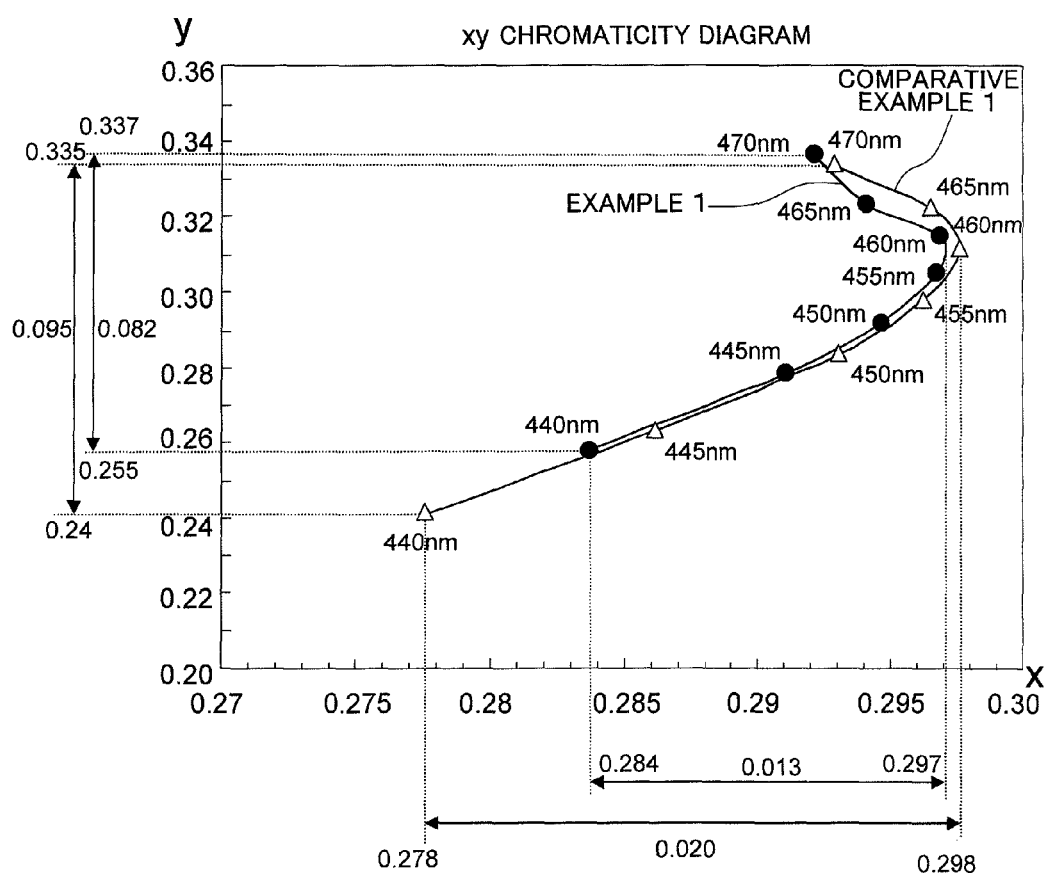

FIG. 4 shows an xy chromaticity diagram that is a result of the chromaticity measurement of the transfer sheets for the phosphor layer of Example 1 and Comparative Example 1.

DETAILED DESCRIPTION OF THE INVENTION

A phosphor layer of the present invention is composed of a resin in which phosphor particles and light scattering particles are dispersed. To be specific, the phosphor layer is formed from a particle-containing resin composition in which the phosphor particles and the light scattering particles are dispersed in the resin.

An example of the phosphor for forming the phosphor particles includes a yellow phosphor that is capable of converting blue light to yellow light. An example of the phosphor includes a phosphor obtained by doping a metal atom such as cerium (Ce) or europium (Eu) into a composite metal oxide or a metal sulfide and the like.

To be specific, examples of the phosphor include garnet type phosphor having a garnet type crystal structure such as $Y_3Al_5O_{12}$:Ce (YAG (yttrium aluminum garnet):Ce), $(Y,Gd)_3Al_5O_{12}$:Ce, $Tb_3Al_3O_{12}$:Ce, $Ca_3Sc_2Si_3O_{12}$:Ce, and $Lu_2CaMg_2(Si,Ge)_3O_{12}$:Ce; silicate phosphor such as $(Sr,Ba)_2SiO_4$:Eu, $Ca_3SiO_4Cl_2$:Eu, $Sr_3SiO_5$:Eu, $Li_2SrSiO_4$:Eu, and $Ca_3Si_2O_7$:Eu; aluminate phosphor such as $CaAl_{12}O_{19}$:Mn and $SrAl_2O_4$:Eu; sulfide phosphor such as ZnS:Cu,Al, CaS:Eu, $CaGa_2S_4$:Eu, and $SrGa_2S_4$:Eu; oxynitride phosphor such as $CaSi_2O_2N_2$:Eu, $SrSi_2O_2N_2$:Eu, $BaSi_2O_2N_2$:Eu, and Ca-α-SiAlN; nitride phosphor such as $CaAlSiN_3$:Eu and $CaSi_5N_8$:Eu; and fluoride-based phosphor such as $K_2SiF_6$:Mn and $K_2TiF_6$:Mn. Preferably, garnet type phosphor is used, or more preferably, $Y_3Al_5O_{12}$:Ce is used.

The shape of the phosphor particles is not particularly limited and may be a shape such as generally sphere shape, generally flat plate shape, and generally needle shape.

The average particle size (the average of the maximum length) of the phosphor particles is in the range of, for example, 0.1 to 30 μm, or preferably 0.2 to 20 μm. The average particle size of the phosphor particles is measured by a particle size distribution measurement device.

The phosphor particles can be used alone or in combination.

The content ratio of the phosphor particles is, for example, 5 to 20 mass %, or preferably 7 to 15 mass % with respect to the particle-containing resin composition. The content ratio of the phosphor particles is, for example, 5 to 30 parts by mass, or preferably 7 to 20 parts by mass per 100 parts by mass of the resin.

Examples of the light scattering particles include inorganic particles such as silica (silicon oxide) particles, alumina (aluminum oxide) particles, and titania (titanium oxide) particles; and organic particles such as acrylic resin particles, polystyrene resin particles, and silicone resin particles.

Inorganic particles are preferably used from the viewpoint of light scattering function.

The refractive index n of the light scattering particles is in the range of, for example, 1.10 to 2.00, or preferably 1.30 to 1.70 from the viewpoint of light scattering function. The refractive index is measured in conformity with the description of JIS K 7142.

The shape of the light scattering particles may be a shape such as generally sphere shape, generally spheroid shape (for example, generally prolate spheroid shape and generally oblate spheroid shape), generally flat plate shape, and generally needle (rod) shape. A generally sphere shape is preferably used.

The light scattering particles are, in its production, formed into the above-described shape as they are. Alternatively, the light scattering particles can be obtained, in its production, by being crushed, once formed as large particles.

The average particle size (the average of the maximum length) of the light scattering particles is in the range of, for example, 1 to 20 μm, or preferably 2 to 10 μm. When the average particle size of the light scattering particles is not in the above-described range, the light conversion by the phosphor particles may be prevented. The average particle size of the light scattering particles is measured by a particle size distribution measurement device.

The light scattering particles can be used alone or in combination of two or more.

The content ratio of the light scattering particles is, for example, 5 to 20 mass %, or preferably 7 to 15 mass % with respect to the particle-containing resin composition. The content ratio of the light scattering particles is, for example, 5 to 30 parts by mass, or preferably 7 to 20 parts by mass per 100 parts by mass of the resin.

When the content ratio of the light scattering particles is below the above-described range, variability in chromaticity caused by variability of the emission wavelength of each of light emitting diodes 11 (described later) may not be sufficiently reduced. On the other hand, when the content ratio of the light scattering particles exceeds the above-described range, the mechanical strength of the phosphor layer may be reduced.

The content ratio of the light scattering particles with respect to the phosphor particles (parts by mass of the light scattering particles/parts by mass of the phosphor particles) is in the range of, for example, 0.7 to 1.3, or preferably 0.75 to 1.0, or more preferably more than 0.75 and less than 1.0.

In other words, the content ratio of the phosphor particles with respect to the light scattering particles (parts by mass of the phosphor particles/parts by mass of the light scattering particles) is in the range of, for example, 0.8 to 1.5, or preferably 1.0 to 1.3, or more preferably more than 1.0 and less than 1.3. When the content ratio of the light scattering particles with respect to the phosphor particles exceeds the above-described range, the light scattering particles may prevent the light conversion by the phosphor particles. On the other hand, when the content ratio of the light scattering particles with respect to the phosphor particles is below the above-described range, variability in chromaticity caused by variability of the emission wavelength of each of the light emitting diodes 11 may not be sufficiently reduced.

The resin is a matrix in which the phosphor particles and the light scattering particles are dispersed, including, for example, transparent resins such as epoxy rein, silicone resin, and acrylic resin.

The epoxy resin and the silicone resin are preferably used from the viewpoint of durability.

Examples of the epoxy resin include aromatic epoxy resins such as bisphenol epoxy resin (for example, bisphenol A epoxy resin, bisphenol F epoxy resin, hydrogenated bisphenol A epoxy resin, and the like) and novolak epoxy resin (for example, phenol novolak epoxy resin, and the like); nitrogen-containing-cyclic epoxy resins such as triepoxypropyl isocyanurate (triglycidyl isocyanurate) and hydantoin epoxy resin; aliphatic epoxy resin; alicyclic epoxy resin such as dicyclo ring-type epoxy resin, and the like; glycidylether epoxy resin such as ethylene glycol diglycidyl ether and polyethylene glycol diglycidyl ether; and triazine epoxy resin.

The epoxy resin has an epoxy equivalent of, for example, 100 to 1200 g/eqiv. The epoxy equivalent is measured in accordance with JIS K 7236 (2001).

The epoxy resin has a viscosity at 25° C. of, for example, 800 to 6000 mPa·s.

These epoxy resins can be used alone or in combination of two or more.

The epoxy resin can also be prepared as an epoxy rein composition by blending a curing agent therein.

The curing agent is a latent curing agent (epoxy resin curing agent) that can cure the epoxy resin by heating, and examples thereof include an imidazole compound, an amine compound, an acid anhydride compound, an amide compound, a hydrazide compound, and an imidazoline compound.

Examples of the imidazole compound include 2-phenyl imidazole, 2-methyl imidazole, and 2-ethyl-4-methyl imidazole.

Examples of the amine compound include polyamines such as ethylene diamine, propylene diamine, diethylene triamine, triethylene tetramine, and amine adducts thereof; methaphenylenediamine; diaminodiphenyl methane; and diaminodiphenyl sulfone.

Examples of the acid anhydride compound include phthalic anhydride, maleic anhydride, tetrahydrophthalic anhydride, hexahydrophthalic anhydride, 4-methyl-hexahydrophthalic anhydride, methyl nadic anhydride, pyromelletic anhydride, dodecenylsuccinic anhydride, dichloro succinic anhydride, benzophenone tetracarboxylic anhydride, and chlorendic anhydride.

Examples of the amide compound include dicyandiamide and polyamide.

An example of the hydrazide compound includes adipic acid dihydrazide.

Examples of the imidazoline compound include methylimidazoline, 2-ethyl-4-methylimidazoline, ethylimidazoline, isopropylimidazoline, 2,4-dimethylimidazoline, phenylimidazoline, undecylimidazoline, heptadecylimidazoline, and 2-phenyl-4-methylimidazoline.

These curing agents can be used alone or in combination of two or more.

The mixing ratio of the curing agent is, depending on the equivalent ratio of the curing agent to the epoxy resin, for example, 1 to 80 parts by mass per 100 parts by mass of the epoxy resin.

The above-described epoxy resin and curing agent are blended at the above-described mixing ratio and are stirred and mixed, thereby preparing an epoxy rein composition.

The silicone resin has, in its molecule, a main chain mainly composed of the siloxane bond (—Si—O—Si—) and a side chain in which an organic group such as an alkyl group (for example, methyl group, and the like) or an alkoxyl group (for example, methoxy group) is attached to silicon atoms (Si) of the main chain.

To be specific, examples of the silicone resin include dehydration condensation type silicone resin, addition reaction type silicone resin, peroxide curable silicone resin, moisture curable silicone resin, and curable silicone resin. The addition reaction type silicone resin is preferably used.

The silicone resin has a kinetic viscosity at 25° C. in the range of, for example, 10 to 30 mm$^2$/s.

The resin can be used alone or in combination of two or more.

The mixing ratio of the resin, in the particle-containing resin composition, is the remaining portion of the above-described phosphor particles and light scattering particles and is, to be specific, for example, 60 to 90 mass %, or preferably 70 to 86 mass %.

The phosphor particles and the light scattering particles are blended into the resin at the above-described ratio and are stirred and mixed, thereby preparing a particle-containing resin composition.

Figure 1:
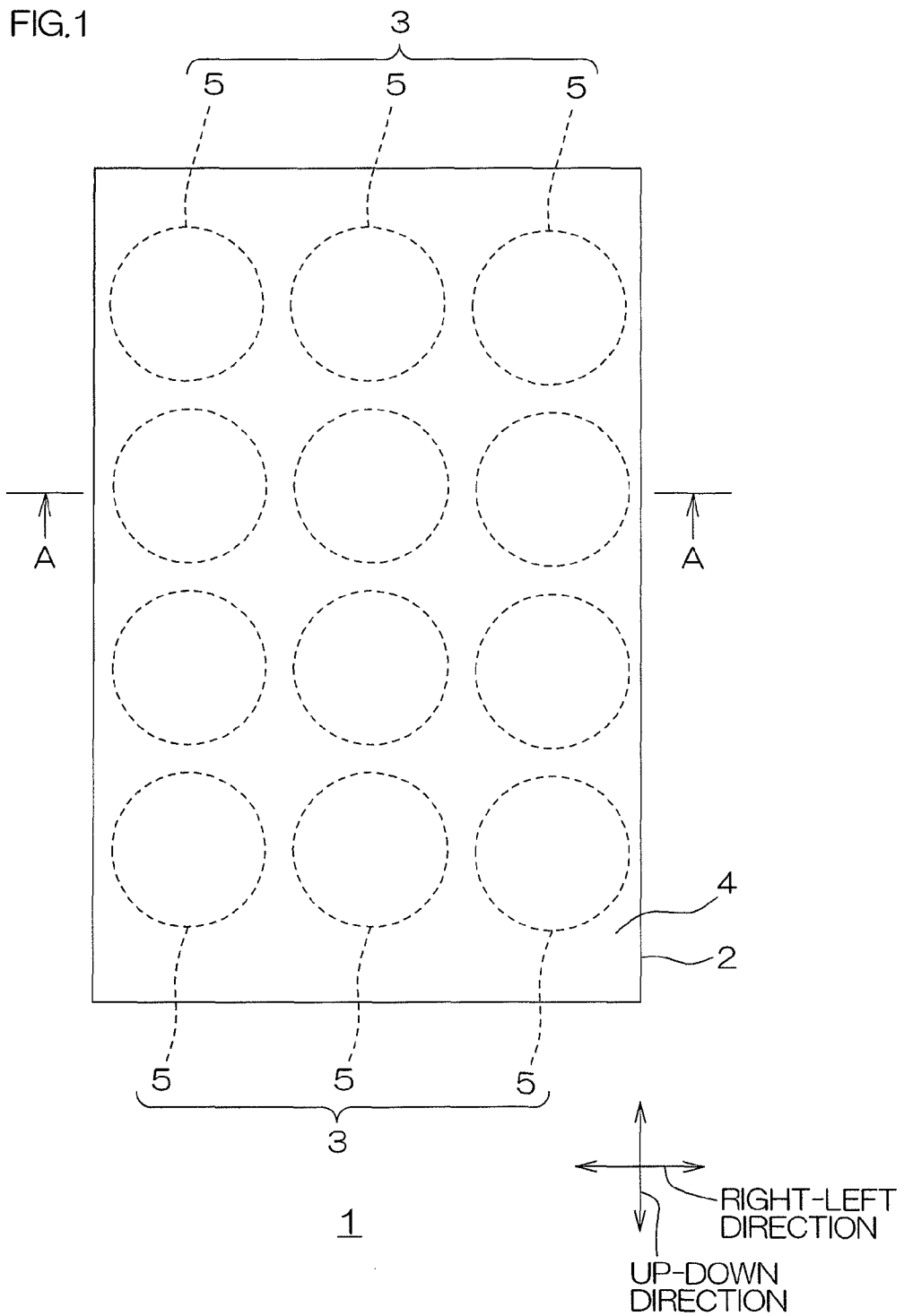
FIG. 1 shows a plan view of a transfer sheet for a phosphor layer including the phosphor layer of an embodiment of the present invention.

FIG. 1 shows a plan view of a transfer sheet for a phosphor layer including the phosphor layer of an embodiment of the present invention. FIG. 2 shows process drawings for fabricating the transfer sheet for the phosphor layer. FIG. 3 shows process drawings for fabricating a light-emitting device of an embodiment of the present invention. In FIG. 1, the up-down direction of the paper surface is referred to as the front-rear direction and the right-left direction of the paper surface is referred to as the right-left direction for descriptive purposes.

Next, a phosphor layer made of the above-described particle-containing resin composition and a light-emitting device including the phosphor layer are described with reference to FIGS. 1 to 3.

In FIG. 1 and FIG. 2 (*e*), a transfer sheet for a phosphor layer 1 is formed into a generally rectangular flat plate shape and includes a release substrate 2, a phosphor layer 3 formed on the release substrate 2, and an adhesive layer 4 formed on the phosphor layer 3.

The release substrate 2 is formed so as to correspond to the outer shape of the transfer sheet for the phosphor layer 1 in plane view and to be specific, is formed into a generally rectangular flat plate sheet shape.

To be specific, examples of the material for forming the release substrate 2 include resin materials such as polyethylene, polypropylene, and polyethylene terephthalate; and metal materials such as iron, aluminum, and stainless steel. The resin materials are preferably used.

Furthermore, the surface (the upper surface) of the release substrate 2 is subjected to release treatment such as silicone treatment, long-chain alkyl treatment, or fluorine treatment and the like as required so as to improve the release characteristics from the phosphor layer 3 and the adhesive layer 4.

The thickness of the release substrate 2 is in the range of, for example, 10 to 1000 μm, or preferably 50 to 500 μm.

The phosphor layer 3 is formed on the upper surface of the release substrate 2 and includes a plurality of phosphor portions 5 that are arranged in alignment in spaced relation to each other.

Each of the phosphor portions 5 are arranged in spaced relation to each other in the direction perpendicular to the thickness direction of the transfer sheet for the phosphor layer 1, that is, in the plane direction of the release substrate 2, and to be specific, in the front-rear direction and the right-left direction thereof. The phosphor portions 5 are arranged in alignment, for example, in a pattern of four rows in the front-rear direction and three rows in the right-left direction. Each of the phosphor portions 5 is arranged so as to correspond to each of the regions separated by a housing 15 to be described later.

The phosphor portions 5 are formed into a generally circular shape in plane view.

The phosphor layer 3 is made of the above-described particle-containing resin composition.

The thickness of the phosphor layer 3 is in the range of, for example, 20 to 500 μm, or preferably 50 to 300 μm.

The adhesive layer 4 is formed so as to correspond to the outer shape of the transfer sheet for the phosphor layer 1 and to be specific, is formed so as to expose the circumference end portions of the release substrate 2. That is, the adhesive layer 4 is formed into a generally flat plate sheet shape so as to cover the surface of the phosphor layer 3 and the surface (except for the circumference end portions) of the release substrate 2 exposed from the phosphor layer 3. To be specific, the adhesive layer 4 is in contact with the surfaces (the upper surfaces and the peripheral side surfaces) of each of the phosphor portions 5 and the surface (the upper surface) of the release substrate 2 among each of the phosphor portions 5.

The adhesive layer 4 is formed from adhesive composition such as an epoxy adhesive composition, a silicone adhesive composition, a urethane adhesive composition or an acrylic adhesive composition. Of the adhesive compositions, preferably, an epoxy adhesive composition and a silicone adhesive composition are used, or more preferably an epoxy adhesive composition is used.

The epoxy adhesive composition contains, for example, the above-described epoxy resin and curing agent. The same epoxy resin and curing agent as illustrated in the above-described resin are used therefor.

The thickness T1 of the adhesive layer 4, that is, the height from the upper surface of the phosphor layer 3 to the upper surface of the transfer sheet for the phosphor layer 1 is in the range of, for example, 1 to 1000 μm.

To fabricate the transfer sheet for the phosphor layer 1, as shown in FIG. 2 (*a*), the release substrate 2 is first prepared.

Next, as shown in FIG. 2 (*b*), a particle-containing resin composition 8 is applied onto the release substrate 2. A solvent such as toluene can be blended into the particle-containing resin composition 8 at an appropriate ratio so as to adjust the viscosity thereof as required.

In the application of the particle-containing resin composition 8, for example, the printing method is used. In the printing method, for example, a screen 6 that is formed in a pattern reverse to the pattern of the phosphor portions 5 is placed on the release substrate 2. Next, the particle-containing resin composition 8 is printed with a squeegee 7 via the screen 6. In the printing method, the upper surfaces of each of the phosphor portions 5 are flush with the upper end surface of the screen 6 to become flat, so that the particle-containing resin composition 8 can be applied evenly and easily.

Thereafter, after the solvent is removed by heating as required, the screen 6 is lifted from the release substrate 2, so that as shown in FIG. 2 (c), the phosphor layer 3 including a plurality of the phosphor portions 5 is formed.

Next, as shown in FIG. 2 (d), an adhesive composition 9 is applied onto the release substrate 2 so as to cover the phosphor layer 3. A solvent such as carbitol acetate can be blended into the adhesive composition 9 at an appropriate ratio so as to adjust the viscosity thereof as required.

In the application of the adhesive composition 9, for example, the printing method or the coating method is used. The printing method is preferably used. In the printing method, for example, a frame member 21 is placed on the circumference end portions of the release substrate 2. Next, the adhesive composition 9 is printed with the squeegee 7. In the printing method, the upper surface of the adhesive layer 4 is flush with the upper end surface of the frame member 21 to become flat, so that the adhesive composition 9 can be applied evenly and easily.

Thereafter, after the solvent is removed by heating as required, the frame member 21 is lifted from the release substrate 2, so that as shown in FIG. 2 (e), the adhesive layer 4 is formed.

The transfer sheet for the phosphor layer 1 can be obtained in this manner.

Next, a method for fabricating a light-emitting device 18 using the transfer sheet for the phosphor layer 1 is described with reference to FIG. 3.

In this method, as shown in FIG. 3 (a), a board 10 and a plurality of the light emitting diodes 11 provided thereon are first prepared.

The board 10 includes a base board 13, a conductive pattern 14 formed on the upper surface of the base board 13, and a housing 15 provided to stand upward from the upper surface of the base board 13.

The base board 13 is formed into a generally rectangular flat plate shape in plane view and is formed from a known insulating resin such as a polyimide resin and the like.

The conductive pattern 14 electrically connects terminals of a plurality of the light emitting diodes 11 to terminals (not shown) of a power source for supplying electric power to each of the light emitting diodes 11. The conductive pattern 14 is formed from a conductive material such as copper, iron and the like.

The housing 15 is arranged so as to surround each of the light emitting diodes 11 one by one in plane view and is formed into a generally trapezoidal shape in sectional view in which the width thereof gradually becomes narrower as going upward. In this way, the housing 15 separates each of the regions that houses each of the light emitting diodes 11 one by one. A plurality of the light emitting diodes 11 are arranged in alignment, so that the housing 15 is formed into a generally grid shape in plane view.

The region separated by the housing 15 is formed into a generally circular shape that is a little smaller than the phosphor portion 5 in plane view.

An example of the light emitting diode 11 includes a blue light emitting diode (blue LED) that mainly emits blue light.

A plurality of the light emitting diodes 11 are provided on the base board 13. Each of the light emitting diodes 11 is provided in each of the regions separated by the housing 15 and is electrically connected (wire bonding) to the conductive pattern 14 via a wire 16. The light emitting diodes 11 can be obtained by the dicing of the wafer.

On the base board 13, a sealing layer 12 is filled in each of the regions separated by the housing 15, so that each of the light emitting diodes 11 is sealed. The sealing layer 12 is, for example, formed from a known sealing resin such as a silicone resin and the upper surface thereof is formed to be flush with the upper surface of the housing 15 in the thickness direction.

Next, in this method, as shown in FIG. 3 (b), the phosphor layer 3 is transferred on the board 10 using the above-described transfer sheet for the phosphor layer 1.

To be specific, the surface (the lower surface (the back surface) in FIG. 3 (b) and the upper surface in FIG. 2 (e)) of the adhesive layer 4 of the transfer sheet for the phosphor layer 1 is allowed to come into contact with the surface (the upper surface) of the housing 15 of the board 10 and the surface (the upper surface) of the sealing layer 12.

In the transfer, each of the phosphor portions 5 covers the upper side of each of the light emitting diodes 11 via the adhesive layer 4 so that each of the phosphor portions 5 corresponds to each of the regions separating each of the light emitting diodes 11, that is, each of the phosphor portions 5 and each of the light emitting diodes 11 to be one-to-one correspondence.

In this way, the phosphor layer 3 is attached to the upper surfaces of the housing 15 and the sealing layer 12 via the adhesive layer 4.

The phosphor layer 3 is provided so as to cover the light emitting diodes 11. To be specific, the phosphor layer 3 is provided so that each of the phosphor portions 5, in plane view, includes each of the regions separated by the housing 15 corresponding to the light emitting diodes 11. In particular, each of the phosphor portions 5 covers the upper side of each of the light emitting diodes 11 so that each of the phosphor portions 5 is to be one-to-one correspondence to the above-described each of the regions.

Next, as shown in phantom lines of FIG. 3 (b), the release substrate 2 is peeled off from the surface (the upper surface) of the phosphor layer 3 and the surface (the upper surface) of the adhesive layer 4 exposed from each of the phosphor portions 5.

Thereafter, as shown in FIG. 3 (c), the adhesive layer 4 is cured by heating. The heating temperature is, for example, 100 to 150° C.

In this way, the phosphor layer 3 is adhered to the upper surfaces of the housing 15 and the sealing layer 12 via the adhesive layer 4.

The adhesive layer 4 shrinks mainly in the thickness direction due to the above-described curing. The thickness (the height from the lower surface of the phosphor layer 3 to the upper surfaces of the housing 15 and the sealing layer 12) T2 of the adhesive layer 4 after the curing is, for example, 1 to 1000 μm.

Thereafter, as shown in FIG. 3 (d), a plurality of lenses 17 are provided on each of the phosphor portions 5. The lenses 17 are formed into a generally semi-sphere shape (generally dome shape) and are provided via a known adhesive layer (not shown) so as to cover above the sealing layer 12 that seals each of the light emitting diodes 11. The lenses 17 are formed from a transparent resin such as a silicone resin.

The above-described phosphor layer 3 is composed of a resin in which the phosphor particles and the light scattering particles are dispersed, so that in the light-emitting device 18, even when variability of the blue light emission wavelength occurs among each of the light emitting diodes 11, the conversion to the yellow light can be achieved while reducing variability in chromaticity by the phosphor layer 3 that covers each of the light emitting diodes 11.

Therefore, the emission of the white light in which variability in chromaticity is reduced can be achieved in the light-emitting device 18 or among a plurality of the light-emitting devices 18 obtained by dicing so as to correspond to each of the light emitting diodes 11.

According to the above-described transfer sheet for the phosphor layer 1, the phosphor layer 3 can be easily adhered to the board 10 via the adhesive layer 4 by an easy method of transferring the phosphor layer 3 on the board 10. Therefore, the light-emitting device 18 can be obtained by an easy method with excellent production costs.

In the above-described description of FIG. 2 and FIG. 3, in the fabrication of the light-emitting device 18, the phosphor layer 3 is first formed on the release substrate 2 to form the transfer sheet for the phosphor layer 1. Thereafter, by using this, the phosphor layer 3 is transferred on the board 10. However, though not shown, the phosphor layer 3 can be directly formed on the board 10.

That is, as shown in FIG. 3 (a), the particle-containing resin composition 8 is directly applied onto the upper surfaces of the sealing layer 12 and the housing 15 by a coating method such as screen printing. Thereafter, a solvent is removed by heating as required.

In this method, there is no need to prepare and form the release substrate 2 and the adhesive layer 4, and therefore the phosphor layer 3 can be easily formed.

In the above-described description, the sealing layer 12 is provided on the board 10. However, though not shown, for example, a region in which a light emitting diode 11 is housed can be formed into a hollow shape without providing the sealing layer 12.

In the above-described description, the lens 17 is provided in the light-emitting device 18. However, though not shown, for example, the light-emitting device 18 can be composed without providing the lens 17.

In the above-described description, the light emitting diodes 11 are electrically connected (wire bonding) to the conductive pattern 14 via the wire 16. However, though not shown, for example, a terminal is formed on the lower surface of the light emitting diodes 11, and the formed terminal can be electrically connected (flip chip bonding) to the terminal of the conductive pattern 14 by solder and the like without using the wire 16.

Furthermore, in the above-described description, the phosphor layer 3 is provided above the light emitting diodes 11 at spaced intervals thereto. However, for example, the phosphor layer 3 can be provided on the surface (the upper surface and the side surface) of the light emitting diodes 11 so as to directly cover the light emitting diodes 11.

EXAMPLES

While the present invention will be described hereinafter in further detail with reference to Examples and Comparative Examples, the present invention is not limited to these Examples and Comparative Examples.

Example 1

(Production of Transfer Sheet for Phosphor layer)

A release substrate composed of polyethylene terephthalate having a thickness of 50 μm was prepared (ref: FIG. 2 (a)).

50 parts by mass of an epoxy resin (bisphenol A epoxy resin, epoxy equivalent of 650 g/eqiv., viscosity (25° C.) of 2000 mPa·s) and 30 parts by mass of a curing agent (acid anhydride compound) were blended to prepare an epoxy resin composition. 17 parts by mass of phosphor particles composed of $Y_3Al_5O_{12}$:Ce (sphere shape, the average particle size of 17 μm) and 10 parts by mass of silica particles (light scattering particles, sphere shape, refractive index (n): 1.45, the average particle size of 4.6 μm) were blended into 80 parts by mass of the epoxy resin composition and stirred and mixed, thereby preparing a particle-containing resin composition.

Next, the prepared particle-containing resin composition was applied onto a release substrate by the above-described printing method (ref: FIG. 2 (b)). In the printing method, the screen of the above-described pattern was first placed on the release substrate and then the particle-containing resin composition was printed with a squeegee via the screen. Thereafter, the screen was lifted from the release substrate, so that a phosphor layer having a thickness of 300 μm and including a plurality of phosphor portions arranged in alignment was formed (ref: FIG. 2 (c)).

Separately, 50 parts by mass of an epoxy resin (bisphenol A epoxy resin, epoxy equivalent of 600 g/eqiv., viscosity (25° C.) of 2000 mPa·s) and 30 parts by mass of a curing agent (acid anhydride compound) were blended and stirred uniformly, thereby preparing an epoxy adhesive composition.

Next, a frame member was placed on the circumference end portions of the release substrate. Then, the prepared epoxy adhesive composition was printed with the squeegee (ref: FIG. 2 (d)). Thereafter, the frame member was lifted from the release substrate, so that an adhesive layer having a thickness (T1) of 67 μm was formed (ref: FIG. 2 (e)).

A transfer sheet for a phosphor layer was produced in this manner (ref: FIG. 1).

(Fabrication of Light-Emitting Device)

A board including a base board, a conductive pattern, and a housing; and a plurality of blue light emitting diodes were prepared (ref: FIG. 3 (a)). Each of the blue light emitting diodes was sealed by a sealing layer after wire bonding to the conductive pattern via a wire.

Next, a phosphor layer was transferred on the board using the transfer sheet for the phosphor layer that was produced above (ref: FIG. 3 (b)).

That is, the surface of the adhesive layer of the transfer sheet for the phosphor layer was allowed to come into close contact with the upper surface of the housing of the board and the upper surface of the sealing layer, so that each of the phosphor portions of the phosphor layer was attached to the upper surfaces of the housing and the sealing layer via the adhesive layer so as to cover each of the blue light emitting diodes.

Next, the release substrate was peeled off (ref: phantom lines of FIG. 3 (b)).

Thereafter, the adhesive layer was cured by heating at 150° C. (ref: FIG. 3 (c)). The thickness (T2) of the adhesive layer after the curing was 40 μm.

Thereafter, lenses each having a dome shape were provided via an adhesive layer (silicone based). The light-emitting device was fabricated in this manner.

Comparative Example 1

A phosphor layer was formed in the same manner as in Example 1 except that in the preparation of a particle-containing resin composition, silica particles (light scattering particles) were not blended and the thickness of the phosphor layer was 500 μm so as to match the color tone, and then a transfer sheet for a phosphor layer was produced and subsequently, a light-emitting device was fabricated.

(Evaluation)

(Measurement of Chromaticity)

The chromaticity of the transfer sheets for the phosphor layer of Example 1 and Comparative Example 1 was measured with respect to each different wavelength shown in FIG. 4 using a spectroradiometer (multi channel photo detector: MCPD-7000, manufactured by Otsuka Electronics Co., Ltd.) to prepare an xy chromaticity diagram to be shown in FIG. 4.

As obvious in FIG. 4, in the transfer sheet for the phosphor layer of Example 1, the numerical range of the x-axis in the xy chromaticity diagram is 0.013 (=0.297 to 0.284), which is remarkably smaller than that of Comparative Example 1 in which the numerical range thereof is 0.020 (=0.298 to 0.278). That is, it is obvious that variability of the x-axis of Example 1 is smaller than that of Comparative Example 1.

In the transfer sheet for the phosphor layer of Example 1, the numerical range of the y-axis in the xy chromaticity diagram is 0.082 (=0.337 to 0.255), which is smaller than that of Comparative Example 1 in which the numerical range thereof is 0.095 (=0.335 to 0.240). That is, it is obvious that variability of the y-axis of Example 1 is smaller than that of Comparative Example 1.

Therefore, it is obvious that variability of chromaticity based on different wavelength in Example 1 is reduced compared to that in Comparative Example 1.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A transfer sheet for a phosphor layer comprising:
   a release substrate;
   a phosphor layer formed so as to be in direct contact with an upper surface the release substrate; and
   an adhesive layer formed on and in direct contact with the upper surface of the release substrate so as to cover the phosphor layer;
   wherein the adhesive layer is uncured,
   the phosphor layer comprises a resin in which phosphor particles and light scattering particles are dispersed, and
   the phosphor layer comprises a plurality of phosphor portions that are arranged in alignment in spaced relation to each other, and
   the plurality of phosphor portions are made of the same resin in which the same phosphor particles and the same light scattering particles are dispersed.

2. The transfer sheet for the phosphor layer according to claim 1, wherein the adhesive layer covers an upper surface and a side surface of each of the plurality of phosphor portions and is formed on and in direct contact with the release substrate between the plurality of phosphor portions.

3. A method of producing a light-emitting device comprising:
   preparing a board and a light emitting diode provided on the board; and
   transferring the phosphor layer of the transfer sheet for the phosphor layer according to claim 1 onto the board so as to cover the light emitting diode.

4. The method of producing a light-emitting device according to claim 3, wherein the board comprises a base board and a housing provided to stand upward from an upper surface of the base board and arranged so as to surround each light emitting diode one by one;
   wherein the light emitting diode is each arranged in each region separated by the housing;
   wherein the phosphor portions are arranged to correspond to the regions separated by the housing,
   the adhesive layer covers an upper surface and a side surface of each of the plurality of phosphor portions and is formed on and in direct contact with the upper surface of the release substrate between the plurality of phosphor portions, and
   when transferring the transfer sheet for the phosphor layer, a surface of the adhesive layer is transferred onto a surface of the housing of the board such that each of the phosphor portions corresponds to each of the regions separating each of the light emitting diodes and the phosphor portions one-to-one correspond to the light emitting diodes.

* * * * *